United States Patent [19]

Hsu et al.

[11] 4,247,861
[45] Jan. 27, 1981

[54] HIGH PERFORMANCE ELECTRICALLY ALTERABLE READ-ONLY MEMORY (EAROM)

[75] Inventors: Sheng T. Hsu, Lawrenceville; Richard J. Hollingsworth, Princeton, both of N.J.

[73] Assignee: RCA Corporation, New York, N.Y.

[21] Appl. No.: 18,859

[22] Filed: Mar. 9, 1979

[51] Int. Cl.³ .................. H01L 27/02; H01L 29/34; H03K 5/00; G11C 11/34
[52] U.S. Cl. ........................... 357/43; 357/46; 357/54; 307/238; 365/177; 365/184
[58] Field of Search .............. 357/23, 43, 46, 54; 307/238; 365/177, 184

[56] References Cited

U.S. PATENT DOCUMENTS

| | | | |
|---|---|---|---|
| 3,609,479 | 9/1971 | Lin et al. | 357/43 |
| 3,696,276 | 10/1972 | Boland | 357/23 |
| 3,755,721 | 8/1973 | Frohman-Bentchkowsky | 357/43 |
| 3,893,085 | 7/1975 | Hansen | 357/23 |
| 4,004,159 | 1/1977 | Rai et al. | 357/54 |
| 4,090,254 | 5/1978 | Ho et al. | 357/43 |
| 4,173,766 | 11/1979 | Hayes | 357/54 |

OTHER PUBLICATIONS

Carballo et al. "Self-Contained Bipolar-FET Device", IBM Technical Disclosure Bulletin vol. 19 (4/77) pp. 4191-4192.
Gaensslen et al. "Hybrid IGFET-Bipolar Transistor", IBM TechnicalDisclosure Bulletin vol. 12 (5/70) pp. 2327-2328.

Primary Examiner—Gene M. Munson
Attorney, Agent, or Firm—Birgit E. Morris; Donald S. Cohen; Sanford J. Asman

[57] ABSTRACT

The invention is a memory device which includes a metal-nitride-oxide semiconductor (MNOS) insulated gate field effect transistor (IGFET) which is built in series with the base of a bipolar transistor to provide both bipolar current handling capability and bipolar radiation hardness while retaining MNOS memory performance.

10 Claims, 4 Drawing Figures

HIGH PERFORMANCE ELECTRICALLY ALTERABLE READ-ONLY MEMORY (EAROM)

The present invention relates to semiconductor devices, and, in particular, it relates to an integrated circuit memory.

Read Only Memories (ROMs) are used in many electronic systems, such as computer systems. In one type of ROM namely the Electrically Alterable Read Only Memory (EAROM), the memory elements can be appropriately altered or "programmed". Thus, EAROMs are useful for producing ROMs which are used in specialized systems in which the volume of ROMs required does not justify the mass production of a specialized ROM. Heretofore, EAROMs have had limited current handling capability and radiation tolerance.

The present invention relates to an improved EAROM which has both high current handling capabilities and high radiation tolerance.

IN THE DRAWING

Figure 1:
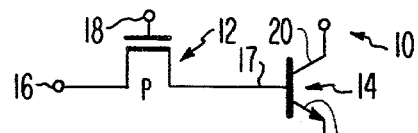
FIG. 1 is a schematic diagram of the memory cell of the present invention.

Referring now to FIG. 1, a schematic diagram of the memory cell 10 of the present invention is shown. The memory cell 10 comprises an MNOS transistor 12 and a bipolar transistor 14. In the preferred embodiment of the present invention, the MNOS transistor 12 is a P channel MNOS transistor whose source is connected to a first terminal 16 and whose drain is connected to the base 17 of the bipolar transistor 14. In the preferred embodiment of the invention, the bipolar transistor 14 is an NPN transistor. The gate 18 of the MNOS transistor 12 and the collector 20 and emitter 22 of the bipolar transistor 14 are connected to other memory cells 10 as will be explained hereinafter.

Figure 2:
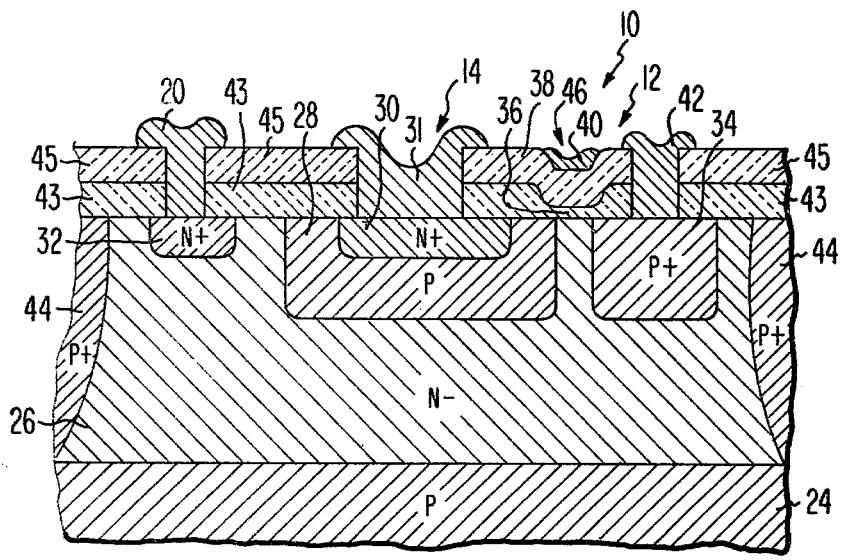
FIG. 2 is a cross-sectional view of one embodiment of the memory cell of the present invention.

Referring now to FIG. 2, the memory cell 10 is shown implemented in a monolithic integrated circuit formed in a substrate 24 of semiconductor material. In the preferred embodiment of the invention, the substrate 24 is comprised of P type silicon. An N— well 26 is formed in the substrate 24 and acts as the collector of the bipolar transistor 14 which has a P type base region 28 and an N+ type emitter 30. Contact to the collector 26 is provided by an N+ region 32 to which a metallic contact 20 makes ohmic contact, and contact to the emitter 30 is provided by metallic contact 31.

The MNOS transistor 12 is comprised of the P type base region 28 of the bipolar transistor 14 which acts as the drain of the MNOS transistor 12. The N— type well 26 acts as the channel region of the MNOS transistor 12, and a P+ region 34 as its source. The P+ region 34 is used as a source of base current for the bipolar transistor 14, so the P+ region 34 is referred to herein as the base injector region 34. A silicon dioxide layer 36 overlies the channel region of the MNOS transistor 12 and a silicon nitride layer 38 overlies the silicon dioxide layer 36. A conductive gate 40 overlies the oxide layer 38 over the channel region of the MNOS transistor 12. Ohmic contact to the source 34 of the MNOS transistor 12 is achieved through the metallic contact 42.

In order for the memory cell 10 to be highly radiation tolerant a "thin oxide" MNOS transistor 12 is employed. The "thin oxide" MNOS transistor has an oxide layer which is approximately 20Å thick and is preferably less than about 60Å thick. It has been found that MNOS transistors having oxide layers on that order are highly tolerant of radiation and are able to withstand on the order of $10^8$ rads-Si. While stepped oxide MNOS transistors can be used in making memory cells of the type described herein, such cells would not have the radiation tolerance provided by the "thin oxide" MNOS transistors manufactured in accordance with the present invention.

The composite channel insulator, comprised of the silicon dioxide layer 36 and the silicon nitride layer 38 is referred to by the reference numeral 46. Outside of the channel region of the MNOS transistor 12 a dual dielectric comprised of a layer of silicon dioxide 43 on the surface of the substrate 24 and a layer of silicon nitride 45 on the surface of the silicon dioxide layer 43 is used in the preferred embodiment of the invention. While the dual dielectric is not necessary except for use as the channel insulator 46 of the MNOS transistor 12, its use provides a manufacturing yield increase through the elimination of undesirable pinholes which might exist if only the silicon dioxide layer 43 was used.

Figure 3:
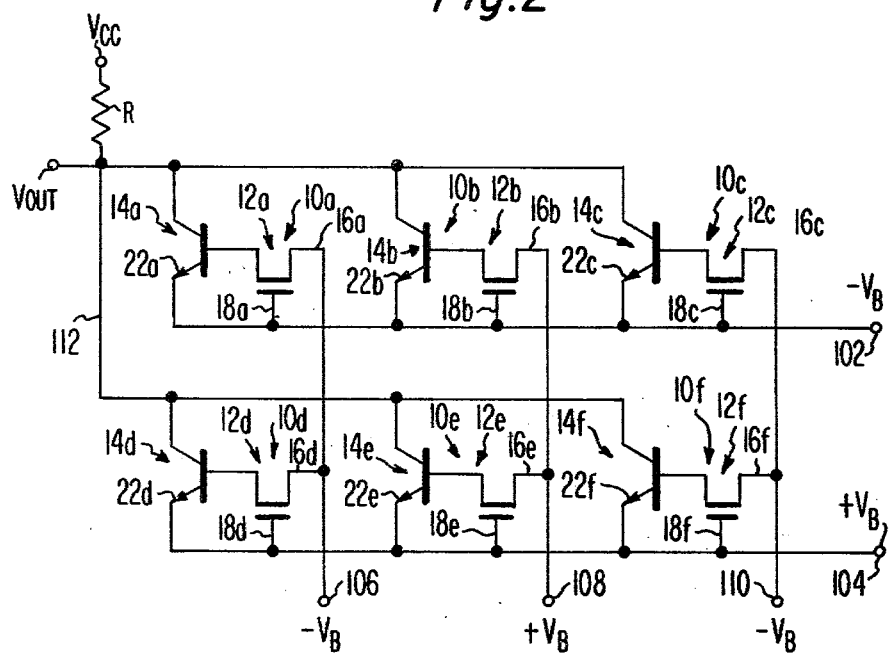
FIG. 3 is a schematic diagram showing one embodiment of a portion of an EAROM manufactured in accordance with the present invention.

Referring now to FIG. 3, a schematic diagram of a portion of an EAROM 100 manufactured in accordance with the present invention is shown. The EAROM 100 includes six memory cells 10a–10f of the type heretofore described with reference to FIG. 1. The memory cells 10a–10f of the EAROM 100 are connected in a 3×2 x-y array with the emitters 22a–22f and the gates 18a–18f of each cell 10a–10f in each row connected together and to lines 102, 104.

The sources 16a–16f of the memory cells 10a–10f of each column are connected together and to lines 106, 108, 110.

In order to address a particular memory cell, for example, memory cell 10b, a positive voltage, $V_B$ is placed on the line 108 connected to the source 16b of the memory cell 10b being addressed. The line 108 corresponds to the column in which the memory cell 10b is located. A negative voltage, i.e. $-V_B$, is placed on the lines 106,110 connected to the sources of the cells 10a, 10c, 10d, and 10f in the other columns. Thus, $+V_B$ is placed on line 108 and $-V_B$ is placed on lines 106 and 110. Similarly, a negative voltage, $-V_B$, is placed on the line 102 connected to the row in which the cell 10b is located and a positive voltage, $+V_B$, is placed on the other row line 104.

Placing the voltages on the lines as described above biases the MNOS transistor 12b of the addressed memory cell 10b toward conduction while simultaneously biasing the MNOS transistors 12a, 12c–12f of the other memory cells 10a, 10c–10f into a non-conductive state. Therefore, only the bipolar transistor 14b of the addressed memory cell 10b receives base current. Accordingly, if the MNOS transistor 12b of the memory cell 10b had been programmed into an "ON" state, its bipolar transistor 14b is turned "ON" and the output voltage of the memory 100, $V_{OUT}$, which is measured at a node 112 connected to the collectors 20a–20f of transistors 14a–14f would go from $V_{CC}$ to approximately $-V_B$. Similarly, any of the other memory cells 10 of the memory 100 can be addressed.

Of course, if the MNOS transistor of the addressed memory cell was biased into its OFF state then there would not be any drive provided to the bipolar transistor and $V_{OUT}$ would remain at $V_{CC}$. By imposing appropriate voltages between terminals 102, 104 and 106, 108, 110 it is possible to write or erase any of the MNOS transistors of the memory cells 10. Such writing or erasing is done in the standard manner, well known in the MNOS art.

Figure 4:
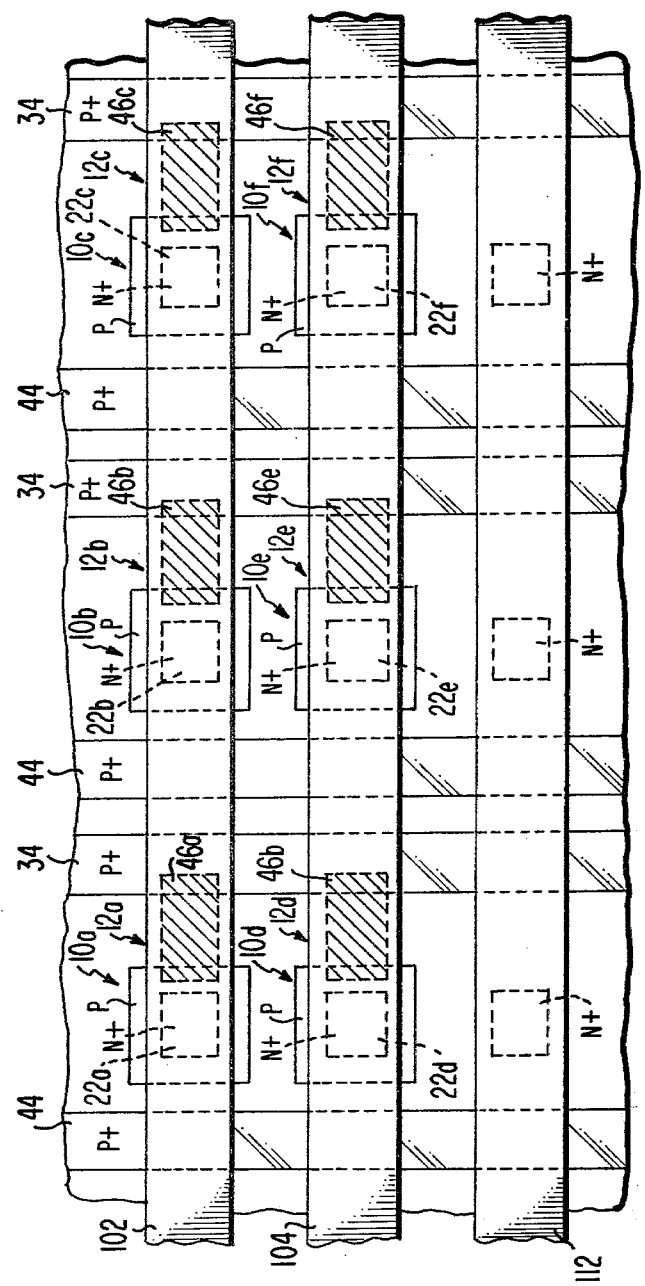
FIG. 4 is a modified plan view of the EAROM shown in FIG. 3.

Referring now to FIG. 4, a top plan view of a portion of the memory 100 of FIG. 3 is shown. The cells 10a–10f are laid out substantially as they are shown schematically in FIG. 3, i.e. in an x-y array with the cells in the same relative positions shown in FIG. 3.

With reference to the cross-sectional view of FIG. 2 the P+ isolation regions 44 run vertically in the plane of the drawing of FIG. 4 as do the P+ base injector regions 34. The thin oxide portions of the channel insulators 46a–46f of the MNOS transistors 12a–12f are shown with oblique hatch lines in FIG. 4. Metal lines 102, 104 are used to simultaneously contact the N+ emitters 22a–22f and to act as the gates 18a–18f of the MNOS transistors 12a–12f. A metal line 112 connects the collectors of the bipolar transistors 14a–14f. All of the collectors in any column share the same portion of the N− well, so a single metal line 112 acts as a common node for all of the collectors. The various metal lines 102,104 112, are aluminum in the preferred embodiment of the invention.

In order to manufacture the EAROM 10 of the present invention one uses conventional photolithographic and semiconductor manufacturing techniques of the type well known in the semiconductor art. In particular, one starts with a P type substrate 24 into which an N− conductivity well 26 is diffused. Alternatively, an N− conductivity epitaxial layer can be grown. Diffusions are made for the P+ isolation regions 44, the P+ base injector regions 34, and the P type bases 28. Then, N+ diffusions for the collector contact 32 and emitter contact 30 are made.

Following the diffusions described above, the surface of the substrate 24 is cleaned and an oxide layer is grown thereon. The portions of the oxide layer over the channel region of the MNOS transistor 12 are removed, and the thin channel oxide for the MNOS transistor 12 is regrown.

Next, a silicon nitride layer is deposited over the entire oxide layer, and the contact openings are defined in the silicon nitride layer. Then, the silicon nitride layer is used as an etch mask and the exposed silicon dioxide is removed from the contact regions. A metal layer, aluminum in the preferred embodiment of the invention, is deposited over the silicon nitride layer and then the metal layer is defined and etched. Finally, a thick protective oxide layer (not shown) is applied over the surface of the device and appropriate bond pad openings (not shown) are formed therein.

Many variations can be made to the preferred embodiment without departing from the present invention. In particular, the MNOS transistor 12 can be replaced by an N channel MNOS transistor and the bipolar transistor 14 can be replaced by a PNP transistor. Also, a "stepped oxide" MNOS transistor can be used in place of the "thin oxide" MNOS transistor, but some radiation tolerance would be lost in that event.

What is claimed is:
1. An integrated circuit memory cell comprising:
  (a) a metal-nitride-oxide-semiconductor (MNOS) transistor comprising:
    (i) a semiconductor layer of a first conductivity type having a pair of spaced regions of opposite conductivity type formed therein, said spaced regions extending to a surface of said semiconductor layer;
    (ii) a first insulating layer on the surface of said semiconductor layer extending at least between said pair of spaced regions, said first insulating layer being comprised of silicon dioxide having a thickness of from 20 angstroms to 60 angstroms;
    (iii) a second insulating layer on the surface of said first insulating layer; and
    (iv) a conductive gate on the surface of said second insulating layer; and
  (b) a bipolar transistor comprising:
    (i) an emitter region of said first conductivity type, said emitter region being formed within one of said spaced regions, said one of said spaced regions comprising the base of said bipolar transistor;
    (ii) means for contacting said emitter; and
    (iii) means for contacting said semiconductor layer, which semiconductor layer comprises the collector of said bipolar transistor; and
  (c) means for connecting said gate of said MNOS transistor to said emitter of said bipolar transistor.

2. The integrated circuit memory cell of claim 1 wherein said semiconductor layer is an N− type well formed in a substrate of P type semiconductor material.

3. The integrated circuit memory cell of claim 2 wherein said semiconductor layer is an N type epitaxial layer formed on a substrate of P type semiconductor material.

4. The integrated circuit memory cell of claim 3 wherein said second insulating layer is comprised of silicon nitride.

5. The integrated circuit memory cell of claim 4 wherein said second insulating layer has a thickness of about 450Å.

6. The integrated circuit memory cell of claim 5 wherein said means for contacting said emitter, said means for contacting said semiconductor layer and said conductive gate are all comprised of metal lines.

7. The integrated circuit memory cell of claim 6 wherein said metal is aluminum.

8. An integrated circuit memory comprising a plurality of integrated circuit memory cells of the type defined in claim 1, said integrated circuit memory including means for connecting together the like means for contacting of said memory cells.

9. The integrated circuit memory of claim 8 wherein said plurality of memory cells are formed in a substrate of semiconductor material in an x-y array and wherein said memory further comprises means for addressing an individual one of said plurality of memory cells.

10. The integrated circuit memory of claim 9 wherein said means for addressing said individual memory cells comprises a series of conductive lines which extend in one direction and a series of diffused conductive lines formed in said semiconductor layer and extending in a direction orthogonal to said one direction.

* * * * *